(12) United States Patent
Kim et al.

(10) Patent No.: US 7,868,337 B2
(45) Date of Patent: Jan. 11, 2011

(54) LIGHT EMITTING DIODE AND METHOD FOR MANUFACTURING THE SAME

(75) Inventors: Hwa Mok Kim, Ansan-si (KR); Duck Hwan Oh, Ansan-si (KR); Dae Won Kim, Ansan-si (KR); Dae Sung Kal, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 195 days.

(21) Appl. No.: 12/136,915

(22) Filed: Jun. 11, 2008

(65) Prior Publication Data

US 2008/0315244 A1 Dec. 25, 2008

(30) Foreign Application Priority Data

Jun. 25, 2007 (KR) .................. 10-2007-0062196

(51) Int. Cl.
*H01L 33/00* (2010.01)
(52) U.S. Cl. .................. 257/97; 257/13; 257/18; 257/28; 257/88; 257/101
(58) Field of Classification Search .................. 257/28
See application file for complete search history.

(56) References Cited

U.S. PATENT DOCUMENTS 5,684,309 A * 11/1997 McIntosh et al. ............ 257/191
2006/0027814 A1 * 2/2006 Watanabe et al. ............ 257/79

FOREIGN PATENT DOCUMENTS

KR 10-2000-0074844 12/2000

* cited by examiner

*Primary Examiner*—N Drew Richards
*Assistant Examiner*—Kyoung Lee
(74) *Attorney, Agent, or Firm*—H.C. Park & Associates, PLC (57) ABSTRACT

Provided are a light emitting diode (LED) and a method for manufacturing the same. The LED includes an n-type semiconductor layer, an active layer, and a p-type semiconductor layer. The active layer includes a well layer and a barrier layer that are alternately laminated at least twice. The barrier layer has a thickness at least twice larger than a thickness of the well layer.

8 Claims, 8 Drawing Sheets

LIGHT EMITTING DIODE AND METHOD FOR MANUFACTURING THE SAME

CROSS-REFERENCE TO RELATED APPLICATION

This application claims priority to Korean Patent Application No. 10-2007-0062196 filed on Jun. 25, 2007, and all the benefits accruing therefrom under 35 U.S.C. §119, the contents of which are incorporated by reference in their entirety.

BACKGROUND

The present disclosure relates to a light emitting diode and a method for manufacturing the same, and more particularly, to a light emitting diode and a method for manufacturing the same which can improve light emitting efficiency by increasing internal quantum efficiency.

Generally, light emitting diodes (LEDs) emit light of a visible wavelength band or near-infrared and infrared wavelength bands by applying a forward current to a p-n junction formed on a group-III or group-V compound semiconductor wafer. Therefore, they are applied to various fields such as display, communication, instrumentation, control, and lighting.

Figure 1:
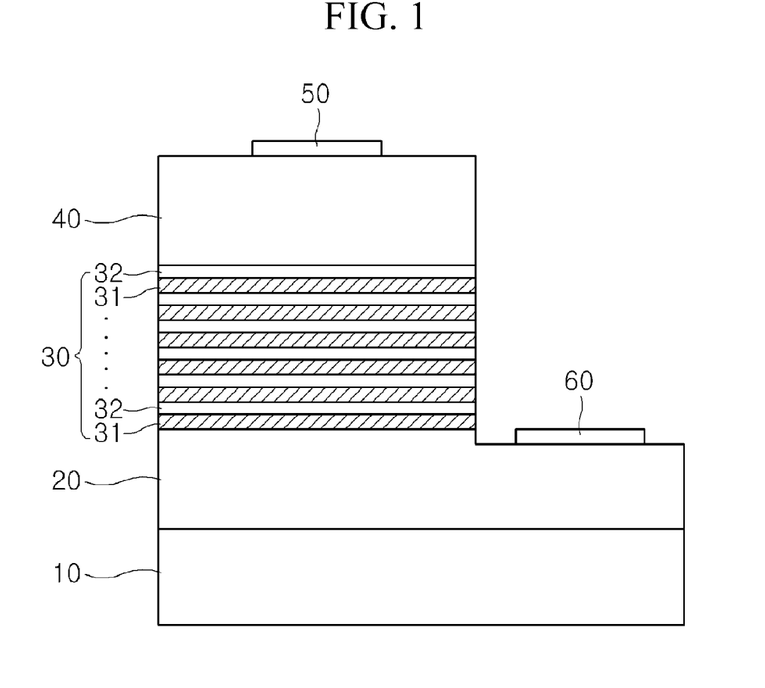
FIG. 1 is a cross-sectional view of a related art LED.

FIG. 1 is a cross-sectional view of a related art LED. Referring to FIG. 1, the related art LED includes a substrate 10, an n-type semiconductor layer 20, an active layer 30, a p-type semiconductor layer 40, a p-type electrode 50, and an n-type electrode 60.

The n-type semiconductor layer 20, the active layer 30, and the p-type semiconductor layer 40 are sequentially formed on the substrate 10. The p-type electrode 50 is formed on the p-type semiconductor layer 40, and the n-type electrode 60 is formed on an exposed portion of the n-type semiconductor layer 20. The active layer 30 has a quantum well structure where well layers 31 and barrier layers 32 are alternately laminated. The well layers have a low energy band gap and the barrier layers 32 have a higher energy band gap than the well layers 31. Here, the well layers 31 and the barrier layers 32 are alternately laminated once or several times to form a single quantum well structure or a multiple quantum well structure.

Various studies have been continuously conducted to improve an internal quantum efficiency of an LED including an active layer which has a quantum well structure. For example, studies for modifying materials or the number of active layers have been conducted or are currently on the way.

SUMMARY

The present disclosure provides an LED and a method for manufacturing the same which can improve light emitting efficiency by increasing internal quantum efficiency.

In accordance with an exemplary embodiment, a light emitting diode (LED) may include: an n-type semiconductor layer; an active layer formed by alternately laminating a well layer and a barrier layer at least twice; and a p-type semiconductor layer, and the barrier layer is at least twice as thick as the well layer.

The barrier layer may be approximately 10 to 15 times as thick as the well layer.

The barrier layer may include a first barrier layer that is formed adjacent to the p-type semiconductor layer, and second barrier layers that are the rest of the barrier layers except for the first barrier layer; a first region of the first barrier layer is doped with n-type impurity; a second region of the first barrier layer is undoped; and at least one of the second barrier layers is doped with n-type impurity.

The first region of the first barrier layer may be adjacent to the well layer, and the second region may be adjacent to the p-type semiconductor layer.

The second region may be at least approximately 1.5 times as thick as the first region.

The first region may be doped so that the concentration of the n-type impurity is decreased as getting closer to the second region.

In accordance with another exemplary embodiment, a method for manufacturing a light emitting diode (LED) may include: forming an n-type semiconductor layer on a substrate; forming an active layer by alternately laminating a well layer and a barrier layer at least twice; and forming a p-type semiconductor layer on the active layer, wherein forming the active layer includes forming the barrier layer to be at least twice as thick as the well layer.

Forming the active layer may include forming the barrier layer to be approximately 10 to 15 times as thick as the well layer.

Forming the active layer may include doping at least a portion of a first barrier layer adjacent to the p-type semiconductor layer with n-type impurity, and doping at least one of second barrier layers that are the rest of the barrier layers except for the first barrier layer with n-type impurity.

Doping at least a portion of the first barrier layer with n-type impurity may include doping a first region of the first barrier layer, which is adjacent to the well layer, with n-type impurity, and undoping a second region of the first barrier which is adjacent to the p-type semiconductor layer.

Doping at least a portion of the first barrier layer with n-type impurity may include forming the second region to be at least approximately 1.5 times as thick as the first region.

Doping at least a portion of the first barrier layer with n-type impurity may include doping the first region so that the concentration of the n-type impurity is decreased as getting closer to the second region.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, exemplary embodiments of the present invention will be described in detail with reference to the accompanying drawings.

Figure 2A:
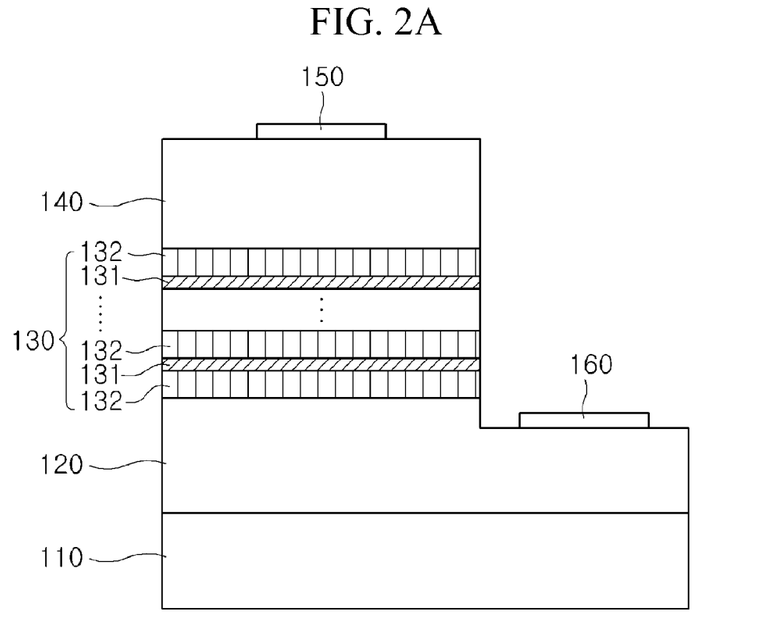
FIG. 2A is a cross-sectional view of an LED in accordance with a first exemplary embodiment.
Figure 2B:
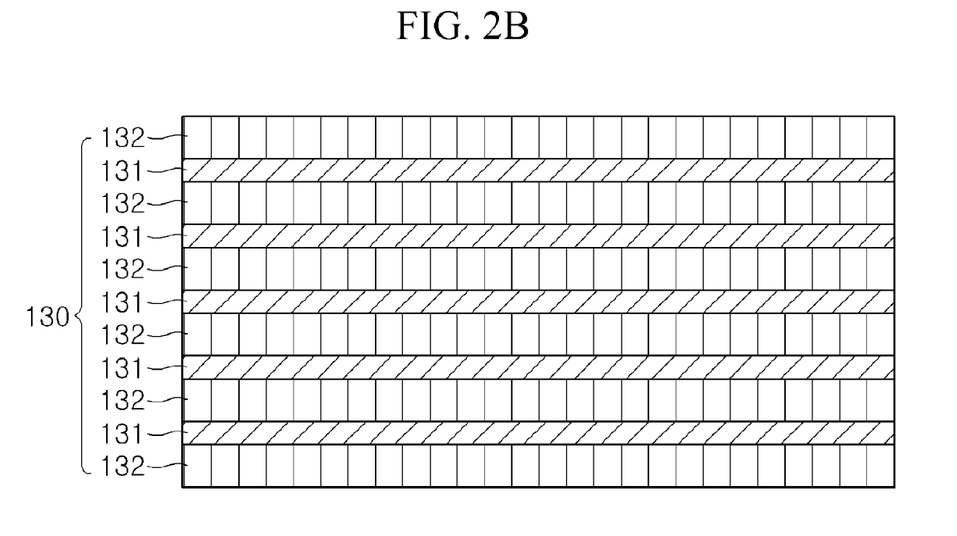
FIG. 2B is an enlarged cross-sectional view of an active layer in FIG. 2A.
Figure 3:
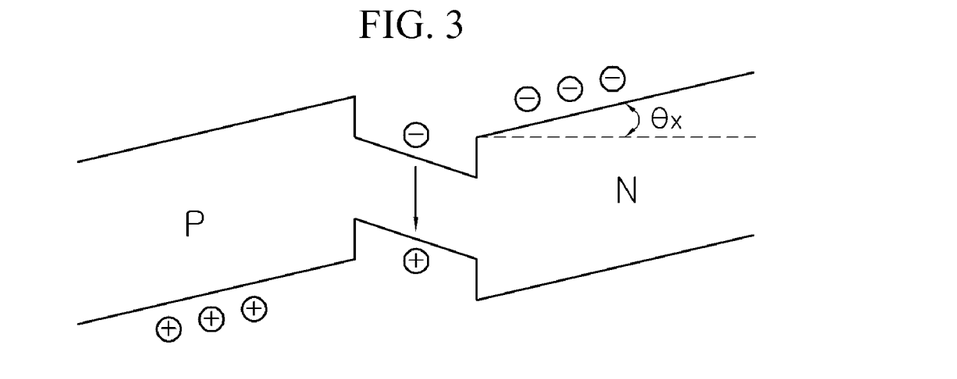
FIG. 3 is a schematic view illustrating change in band gap of an LED depending on change in thickness of a barrier layer.

FIG. 2A is a cross-sectional view of an LED in accordance with a first exemplary embodiment, FIG. 2B is an enlarged cross-sectional view of an active layer in FIG. 2A, and FIG. 3 is a schematic view illustrating change in band gap of an LED depending on change in thickness of a barrier layer.

Referring to FIGS. 2A and 2B, the LED includes a substrate 110, an n-type semiconductor layer 120, an active layer 130, a p-type semiconductor layer 140, a p-type electrode 150, and an n-type electrode 160.

The n-type semiconductor layer 120, the active layer 130, and the p-type semiconductor layer 140 are sequentially formed on the substrate 110. The p-type electrode 150 is formed on the p-type semiconductor layer 140, and the n-type electrode 160 is formed on a predetermined portion of the n-type semiconductor layer 120 which is exposed through an etching process.

The active layer 130 has a quantum well structure where well layers 131 and barrier layers 132 are alternately laminated. The well layers 131 have a low energy band gap and the barrier layers 132 have a higher energy band gap than the well layers 131. The active layer 130 is formed to have a multiple quantum well structure where the well layers 131 and the barrier layers 132 are alternately laminated at least twice.

In this exemplary embodiment, the active layer 130 includes five well layers 131 and six barrier layers 132 that are alternately laminated, however, the number and order of the well layers and barrier layers are not limited thereto. That is, the number and order of the well layers and barrier layers may be variously modified. Indium gallium nitride (InGaN) may be used for the well layer 131. The band gap energy is determined depending on In content of the well layer 131, so that various wavelengths from ultraviolet to red can be obtained. Gallium nitride (GaN) may be used for the barrier layer 132. However, materials of the well layer 131 and the barrier layer 132 are not limited thereto, but may be variously modified.

The barrier layer 132 may be at least twice as thick as the well layer 131. For example, the barrier layer 132 may be approximately 10 to 15 times as thick as the well layer 131.

In this exemplary embodiment, the well layer 131 is formed to have a thickness of approximately 25 Å and the barrier layer 132 is formed to have a thickness of approximately 100 Å so that the thickness ratio can be approximately 1:4.

Meanwhile, the thickness of the well layer 131 is maintained constant and the thickness of the barrier layer 132 may be further increased, e.g. to approximately 300 Å, so that the thickness ratio can be approximately 1:12.

As described above, when the barrier layer 132 is formed thicker than the well layer 131 over a predetermined ratio, the structure of the energy band gap of the LED changes as illustrated in FIG. 3. That is, as the thickness of the barrier layer 132 is increased, a length of an electric field applied to the active layer 130 of the LED is increased, resulting in an increase of a bending angle $\theta_x$ of the band. As a result, electrons supplied from the n-type semiconductor layer 120 can easily move into a conduction band. Accordingly, an amount of electrons supplied to the active layer 130 increases, and thereby internal quantum efficiency is improved. Therefore, light emitting efficiency of the LED can also be improved.

Figure 4A:
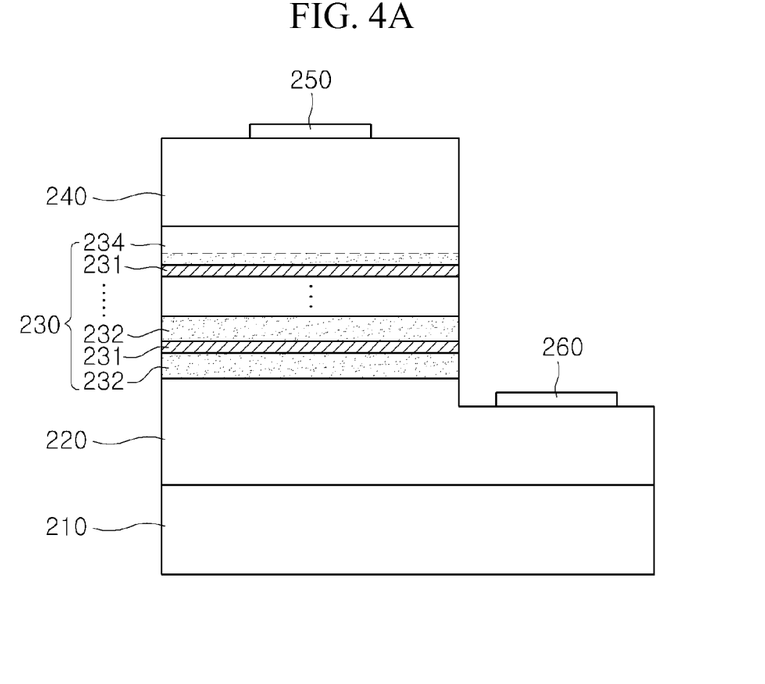
FIG. 4A is a cross-sectional view of an LED in accordance with a second exemplary embodiment.
Figure 4B:
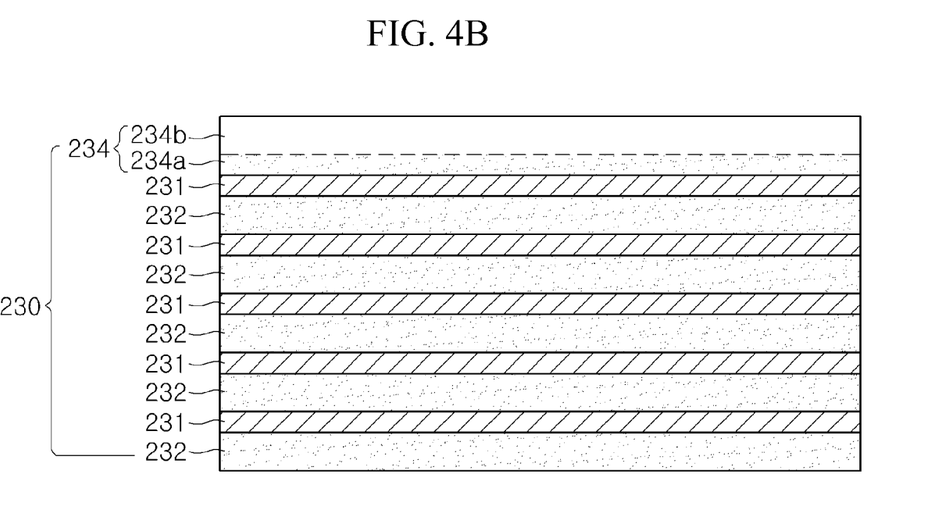
FIG. 4B is an enlarged cross-sectional view of an active layer in FIG. 4A.
Figure 5:
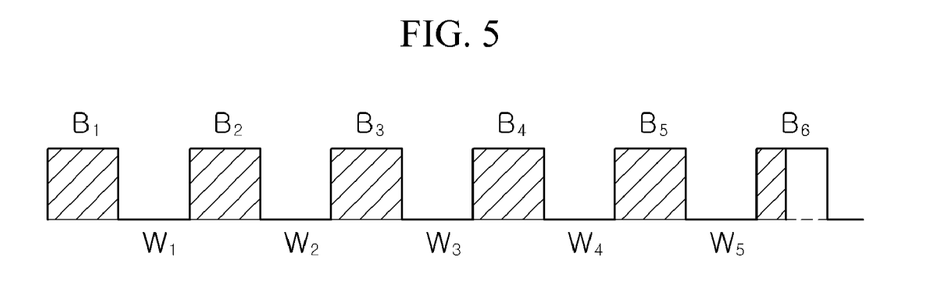
FIG. 5 is a view illustrating a doped state of a first barrier layer and a second barrier layer of the LED in accordance with the second exemplary embodiment.

FIG. 4A is a cross-sectional view of a LED in accordance with a second exemplary embodiment, FIG. 4B is an enlarged cross-sectional view of an active layer in FIG. 4A, and FIG. 5 is a view illustrating a doped state of a first barrier layer and a second barrier layer of an LED in accordance with the second exemplary embodiment.

Referring to FIGS. 4A, 4B, and 5, an n-type semiconductor layer 220, an active layer 230, and a p-type semiconductor layer 240 are sequentially laminated on a substrate 210. A p-type electrode 250 is formed on the p-type semiconductor layer 240, and an n-type electrode 260 is formed on a predetermined portion of the n-type semiconductor 220 which is exposed through an etching process.

The active layer 230 has a quantum well structure in which well layers 231 and second barrier layers 232 are alternately laminated, and a first barrier layer 234 is formed at the uppermost layer. The well layers 231 have a lower energy band gap, and the second barrier layers 232 have a higher energy band gap than the well layers 231. The active layer 230 has a multiple quantum well structure where the well layers 231 and the second barrier layers 232 are alternately laminated at least twice.

That is, the barrier layers of the active layer 230 include the first barrier layer 234 adjacent to the p-type semiconductor layer 240 and the second barrier layers 232 that are the rest of the barrier layers except for the first barrier layer 234.

In this exemplary embodiment, the active layer 230 includes five well layers 231, five second barrier layers 232, and a first barrier layer 234. The first barrier layer 234 is formed at the outermost portion of the active layer 230 and adjacent to the n-type semiconductor layer 240. However, the number and order of the well layers and barrier layers are not limited thereto, but may be variously modified.

Here, only a partial region of the first barrier layer 234 is doped with n-type impurity, and an entire region of at least one of the second barrier layers 232 is doped with n-type impurity. A first region 234a of the first barrier layer 234, which is adjacent to the well layer 231, is doped with n-type impurity. A second region 234b of the first barrier layer 234, which is adjacent to the p-type semiconductor layer 240, is undoped. The second region 234b may be at least 1.5 times as thick as the first region 234a. In this exemplary embodiment, the second region 234b may be twice as thick as the first region 234a, however, such a thickness ratio is not limited thereto. In this exemplary embodiment, $SiH_4$, $SiH_6$ or the like containing Si is used as the n-type impurity. However, materials containing Ge, Sn, Te, S or the like may be used.

The first region 234a may be entirely and uniformly doped with n-type impurity, and alternatively, may be doped asymmetrically. That is, the first region 234a may be doped so that the concentration of the n-type impurity is decreased as getting closer to the second region 234b.

The barrier layers 232 and 234 may be at least twice as thick as the well layers 231. For example, the barrier layers 232 and 234 may be approximately 10 to 15 times as thick as the well layers 231.

As described above, the outermost barrier layer adjacent to the p-type semiconductor layer is doped with n-type impurity only partially, and the other barrier layers other than the outermost barrier layer are doped with n-type impurity entirely. Therefore, internal quantum efficiency is improved, and thereby light emitting efficiency of the LED is improved.

FIGS. 6A through 6E are cross-sectional views illustrating a method for manufacturing an LED in accordance with an exemplary embodiment. Specifically, a method for manufacturing the LED in accordance with the second exemplary embodiment will be described below with reference to FIGS. 6A through 6E.

Figure 6A:
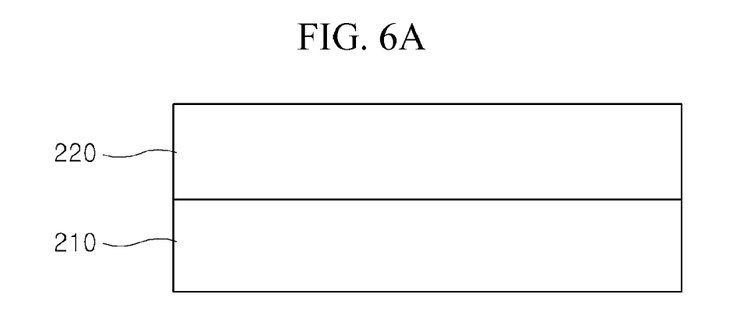
FIGS. 6A through 6E are cross-sectional views illustrating a method for manufacturing an LED in accordance with the second exemplary embodiment.

Referring to FIG. 6A, a substrate 210 is prepared, and an n-type semiconductor layer 220 is formed on the substrate 210. The substrate 210 may be formed of various materials such as sapphire, silicon carbide (SiC), and so on.

In this exemplary embodiment, although n-type GaN is used for the n-type semiconductor layer 220, but the present invention is not limited thereto and various nitride compounds may be used. Also, Si is used for n-type impurity, however, the present invention is not limited thereto and materials such as Ge, Sn, Te, S, and so on may be used.

Figure 6B:
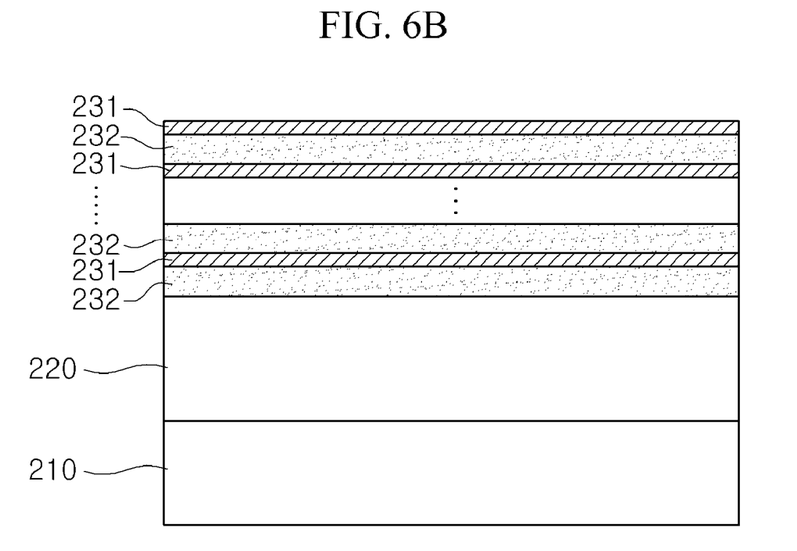
Figure 6C:
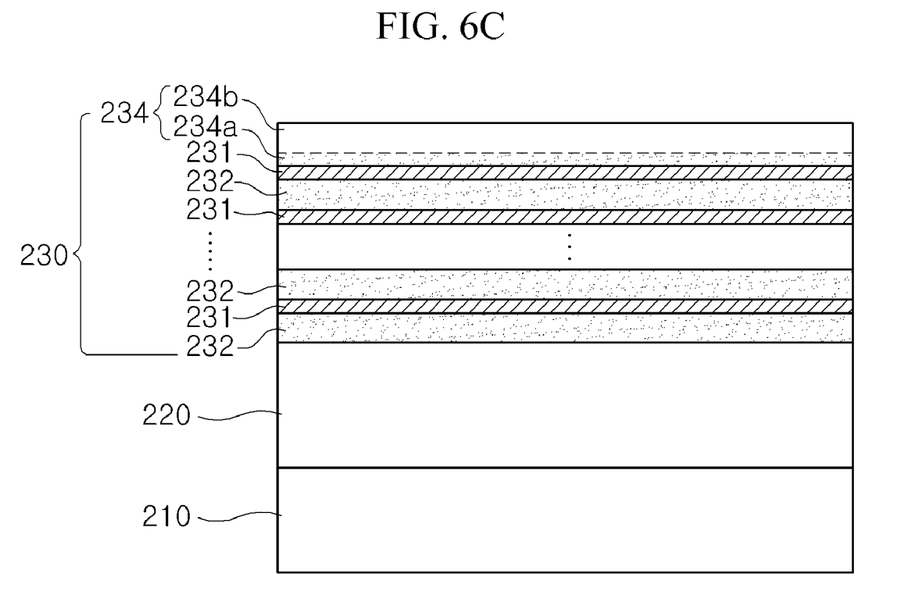

Referring to FIGS. 6B and 6C, an active layer 230 is formed on the n-type semiconductor layer 220. The active layer 230 has a multiple quantum well structure where well layers 231 and second barrier layers 232 are alternately laminated at least twice.

Figure 6D:
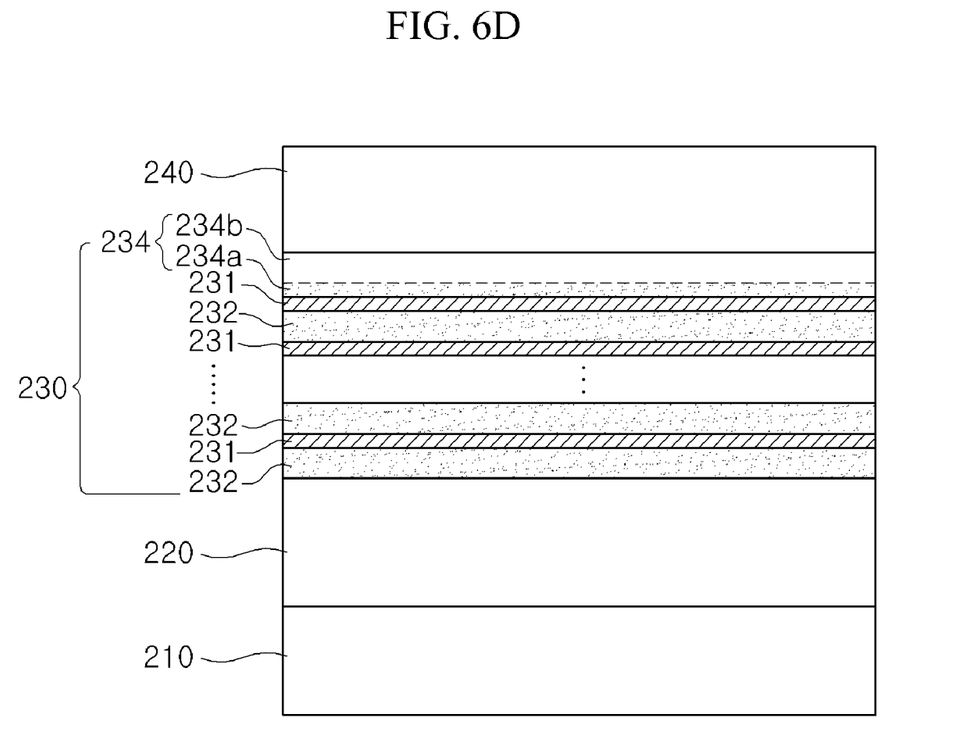

As illustrated in FIG. 6D, after the well layers 231 and the second barrier layer 232 are alternately laminated, a first barrier layer 234 is formed at the outermost portion of the active layer 230 to be adjacent to a p-type semiconductor layer 240.

Here, an entire region of at least one of second barrier layers 232 is doped with n-type impurity, and at least a portion of the first barrier layer 234 is doped with n-type impurity. That is, a first region 234a of the first barrier layer 234 is doped with n-type impurity, and a second region 234b of the first barrier layer 234 is undoped.

Figure 6E:
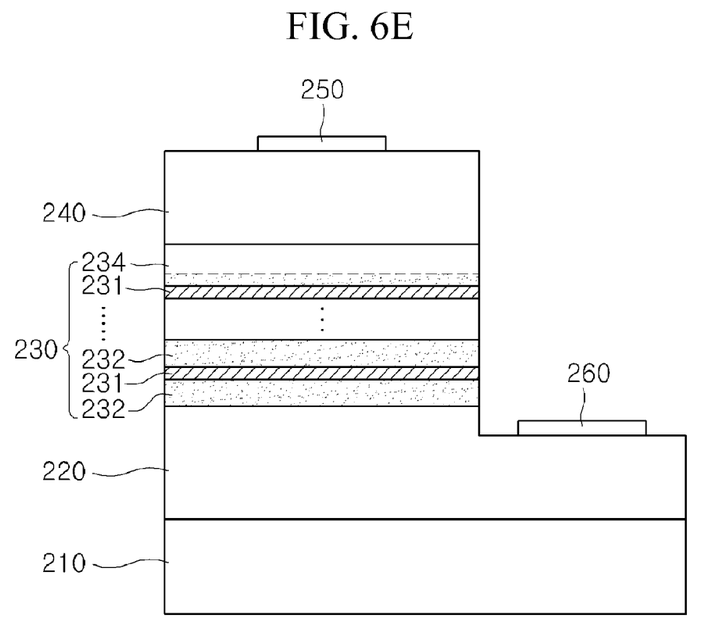

Referring to FIGS. 6D and 6E, the p-type semiconductor layer 240 is formed on the active layer 230. In this exemplary embodiment, although p-type GaN is used for the p-type semiconductor layer 240, but the present invention is not limited thereto and various nitride compounds may be used. In addition, Zn, Cd, Be, Mg, Ca, Sr, Ba, or the like may be used as p-type impurity, however, the present invention is not limited thereto.

Thereafter, the p-type semiconductor layer 240, the active layer 230, and a portion of the n-type semiconductor layer 220 are etched through an etching process such as dry etching. Next, a p-type electrode 250 is formed on the p-type semiconductor layer 240, and an n-type electrode 260 is formed on an exposed portion of the n-type semiconductor layer 220.

Figure 7A:
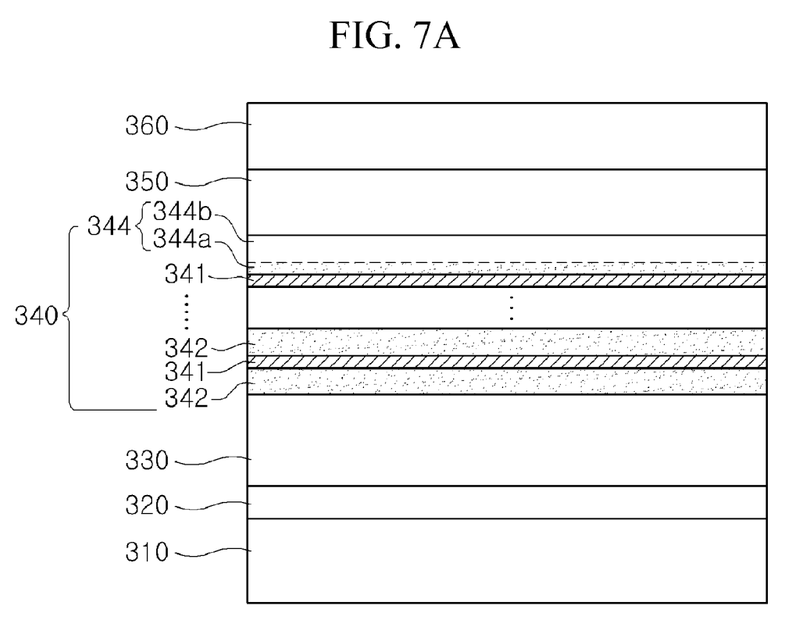
FIGS. 7A through 7C are cross-sectional views illustrating a method for manufacturing a vertical type LED in accordance with a third exemplary embodiment.
Figure 7B:
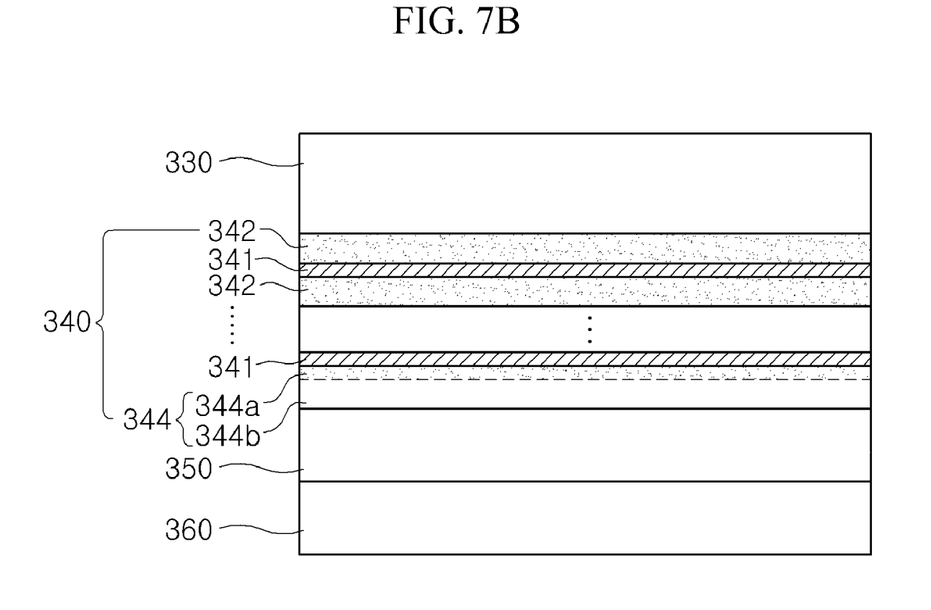
Figure 7C:
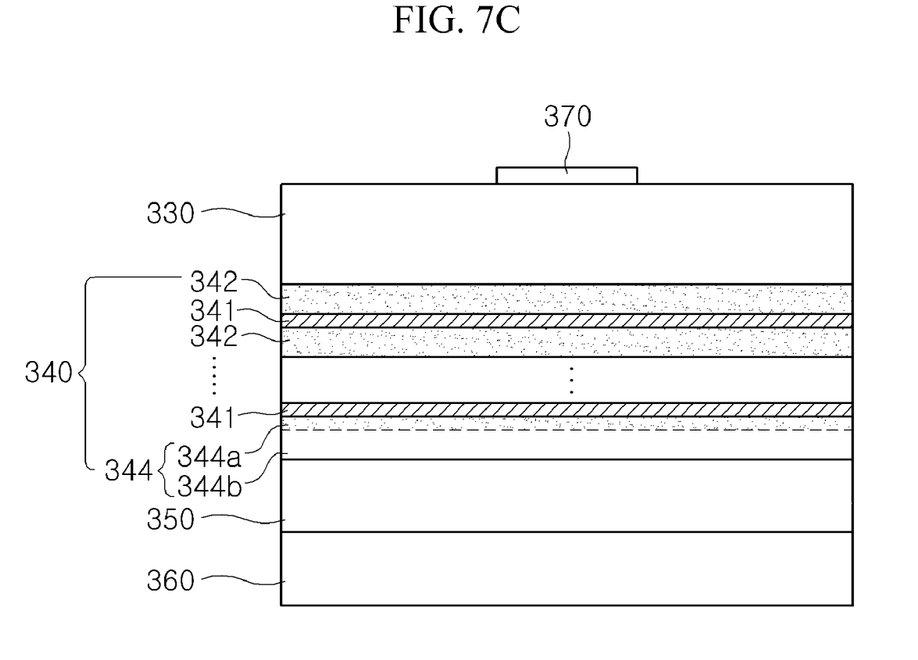

FIGS. 7A through 7C are cross-sectional views illustrating a method of manufacturing a vertical type LED in accordance with a third exemplary embodiment.

Referring to FIG. 7A, a buffer layer 320, an n-type semiconductor layer 330, an active layer 340, a p-type semiconductor layer 350, and a p-type electrode 360 are sequentially formed on a substrate 310.

The active layer 340 includes well layers 341 and second barrier layers 342. After the well layers 341 and the second barrier layers 342 are alternately laminated, a first barrier layer 342 adjacent to the p-type semiconductor layer 350 is formed at the outermost portion of the active layer 340. Here, an entire portion of each second barrier layer 342 is doped with n-type impurity. Only a partial region 344a of the first barrier layer 344 is doped with n-type impurity, and the other region 344b of the first barrier layer 344 is undoped.

Referring to FIG. 7B, the substrate 310 and the buffer layer 320 are sequentially removed through a laser lift-off process to expose the n-type semiconductor layer 330.

Referring to FIG. 7C, an n-type electrode 370 is formed on the exposed n-type semiconductor layer 330 to thereby form the vertical type LED.

As described above, in accordance with the exemplary embodiments, when forming the active layer, barrier layer is formed to be thicker than a well layer to improve internal quantum efficiency of an active layer.

In addition, light emitting efficiency of an LED can be improved by doping only a partial region of the outermost barrier layer of the active layer, i.e. the barrier layer adjacent to a p-type semiconductor layer.

Although the a light emitting diode and a method for manufacturing the same have been described with reference to the exemplary embodiments, they are not limited thereto. Therefore, it will be readily understood by those skilled in the art that various modifications and changes can be made without departing from the spirit and scope of the present invention defined by the appended claims.

What is claimed is:

1. A light emitting diode, comprising:
   an n-type semiconductor layer;
   an active layer formed by alternately laminating a well layer and a barrier at least twice; and
   a p-type semiconductor layer,
   wherein the barrier layer is at least twice as thick as the well layer,
   wherein the barrier layer comprises a first barrier layer that is formed adjacent to the p-type semiconductor layer, and second barrier layers that are the rest of the barrier layers except for the first barrier layer;
   a first region of the first barrier layer is doped with n-type impurity;
   a second region of the first barrier layer is undoped; and
   at least one of the second barrier layers is doped with n-type impurity,
   wherein the first region of the first barrier layer is adjacent to the well layer, and the second region is adjacent to the p-type semiconductor layer.

2. The light emitting diode of claim 1, wherein the barrier layer is approximately 10 to 15 times as thick as the well layer.

3. The light emitting diode of claim 1, wherein the second region is at least approximately 1.5 times as thick as the first region.

4. The light emitting diode of claim 1, wherein the first region is doped so that the concentration of the n-type impurity is decreased as getting closer to the second region.

5. A method for manufacturing a light emitting diode, the method comprising:
   forming an n-type semiconductor layer on a substrate;
   forming an active layer by alternately laminating a well layer and a barrier layer at least twice; and
   forming a p-type semiconductor layer on the active layer,
   wherein forming the active layer comprises forming the barrier layer to be at least twice as thick as the well layer,
   wherein forming the active layer comprises doping at least a portion of a first barrier layer adjacent to the p-type semiconductor layer with n-type impurity, and doping at least one of second barrier layers that are the rest of the barrier layers except for the first barrier layer with n-type impurity,
   wherein doping at least a portion of the first barrier layer with n-type impurity comprises doping a first region of the first barrier layer, which is adjacent to the well layer, with n-type impurity, and not doping a second region of the first barrier which is adjacent to the p-type semiconductor layer.

6. The method of claim 5, wherein forming the active layer comprises forming the barrier layer to be approximately 10 to 15 times as thick as the well layer.

7. The method of claim 5, wherein the second region is at least approximately 1.5 times as thick as the first region.

8. The method of claim 5, wherein doping at least a portion of the first barrier layer with n-type impurity comprises doping the first region so that the concentration of the n-type impurity is decreased as getting closer to the second region.

* * * * *